# (12) United States Patent
Nagano et al.

(10) Patent No.: US 7,112,822 B2
(45) Date of Patent: Sep. 26, 2006

(54) SEMICONDUCTOR DEVICE USING PARTIAL SOI SUBSTRATE AND MANUFACTURING METHOD THEREOF

(75) Inventors: Hajime Nagano, Yokohama (JP); Shinichi Nitta, Yokohama (JP); Hisato Oyamatsu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/013,910

(22) Filed: Dec. 17, 2004

(65) Prior Publication Data

US 2005/0093066 A1 May 5, 2005

Related U.S. Application Data

(62) Division of application No. 10/078,344, filed on Feb. 21, 2002, now Pat. No. 6,855,976.

(30) Foreign Application Priority Data

Dec. 27, 2001 (JP) ............................. 2001-398480

(51) Int. Cl.
*H01L 29/26* (2006.01)
(52) U.S. Cl. .................... 257/79; 257/301; 257/304; 257/305; 257/347; 257/350; 257/67; 257/68; 257/69; 438/694; 438/689
(58) Field of Classification Search ............... 257/301, 257/304, 305, 347, 350, 67, 68, 69; 438/694, 438/689
See application file for complete search history.

(56) References Cited

U.S. PATENT DOCUMENTS 4,855,952 A    8/1989   Kiyosumi

| | | | |
|---|---|---|---|
| 4,864,375 A | | 9/1989 | Teng et al. |
| 5,187,550 A | * | 2/1993 | Yanagisawa ................. 257/307 |
| 5,442,211 A | | 8/1995 | Kita |
| 5,847,438 A | | 12/1998 | Kikuchi et al. |
| 5,894,152 A | | 4/1999 | Jaso et al. |
| 5,970,339 A | | 10/1999 | Choi |
| 6,127,701 A | * | 10/2000 | Disney ........................ 257/338 |
| 6,232,170 B1 | * | 5/2001 | Hakey et al. ................. 438/243 |
| 6,855,976 B1 | * | 2/2005 | Nagano et al. .............. 257/305 |
| 2001/0039088 A1 | * | 11/2001 | Aoki et al. .................. 438/244 |
| 2003/0057487 A1 | * | 3/2003 | Yamada et al. ............. 257/347 |
| 2003/0109140 A1 | * | 6/2003 | Lee ............................. 438/694 |

FOREIGN PATENT DOCUMENTS

| JP | 3-211876 | 9/1991 |
|---|---|---|
| JP | 8-17694 | 1/1996 |
| JP | 11-17001 | 1/1999 |
| JP | 2000-243944 | 9/2000 |
| TW | 451390 | 8/2001 |

* cited by examiner

*Primary Examiner*—Andy Huynh
*Assistant Examiner*—Tram H. Nguyen
(74) *Attorney, Agent, or Firm*—Oblon, Spivak, McClelland, Maier & Neustadt, P.C.

(57) ABSTRACT

A semiconductor device includes a first semiconductor layer formed above a first region of a supporting substrate with a buried oxide layer disposed therebetween and a second semiconductor layer formed on a second region of the supporting substrate. An interface between the supporting substrate and the second semiconductor layer is placed in substantially the same depth position as the undersurface of the buried oxide layer or in a position deeper than the buried oxide layer.

9 Claims, 12 Drawing Sheets

SEMICONDUCTOR DEVICE USING PARTIAL SOI SUBSTRATE AND MANUFACTURING METHOD THEREOF

CROSS-REFERENCE TO RELATED APPLICATIONS

This application is a Divisional of U.S. patent application Ser. No. 10/078,344, filed Feb. 21, 2002 now U.S. Pat. No. 6,855,976, and is based upon and claims the benefit of priority from the prior Japanese Patent Application No. 2001-398480, filed Dec. 27, 2001. The entire contents of these applications are incorporated herein by reference.

BACKGROUND OF THE INVENTION

1. Field of the Invention

This invention relates to a semiconductor device using a partial SOI substrate and a manufacturing method thereof and more particularly to a semiconductor device having elements respectively formed in an SOI region and non-SOI region of a partial SOI wafer in which the non-SOI region is formed by selectively removing portions of a BOX (Buried OXide) layer and silicon layer which are formed on partial regions of an SOI (Silicon On Insulator) substrate and a manufacturing method thereof.

2. Description of the Related Art

The structure having MOSFETs formed on an SOI substrate has a bright future for high-performance logic devices. However, it is known that a parasitic MOSFET or parasitic bipolar transistor is operated depending on the source-drain voltage condition due to the so-called substrate-floating effect when gate voltage which turns OFF the MOSFET is applied and a leakage current flows in the source-drain path. The above characteristic causes a problem of, for example, deterioration of retention for applications in which the specification for the leakage current is strict as in a memory cell transistor of the DRAM, for example, and is not preferable. Further, in the sense amplifier circuit of the DRAM, since the threshold voltages of the paired transistors are shifted due to the substrate-floating effect, the sense margin is lowered. Due to the above problems, it is difficult to form a DRAM with the same MOSFET structure as that of the high-performance logic circuit on the SOI substrate.

Further, demand for a device having the high-performance logic circuit and DRAM mounted together thereon is strong and it is desired to develop the technique for forming the DRAM together with the logic device whose performance is enhanced by use of the SOI structure.

For example, like a DRAM-mounted logic device (embedded DRAM; eDRAM), a partial SOI substrate having an SOI region and non-SOI region is effectively used for forming a circuit which requires both the SOI substrate and bulk substrate. As one of the manufacturing methods for forming the partial SOI substrate, a method for selectively etching and removing a silicon layer (which is referred to as an SOI layer) on a buried oxide layer (BOX layer) and the BOX layer on the SOI substrate and burying silicon in the etched-out region is considered.

FIGS. 1A to 1D are cross-sectional views showing the manufacturing steps of forming the partial SOI substrate, for illustrating a manufacturing method of the conventional semiconductor device. An SOI substrate 11 shown in FIG. 1A is formed by bonding a supporting substrate 12, BOX layer 13 and SOI layer 14 by use of the wafer bonding method or the like.

Next, as shown in FIG. 1B, the SOI layer 14 on the SOI substrate 11 is partially removed. Then, part of the BOX layer 13 which corresponds to the removed portion of the SOI layer 14 is removed to form an opening 15 and expose the surface of the supporting substrate 12 as shown in FIG. 1C.

After this, as shown in FIG. 1D, a silicon layer 16 is formed on the supporting substrate 12 in the opening 15 to form a non-SOI region.

If the partial SOI substrate is formed by use of the above method, the distance $\Delta 1$ from the surface 11A of the SOI substrate 11 to a formation interface 16A of the silicon layer 16 becomes almost equal to the sum $\Delta 2$ of the thicknesses of the SOI layer 12 and box layer 13 as shown in FIG. 2 and is approx. 0.3 to 0.6 µm in the present SOI substrate 11.

However, if transistors or trench type memory cells of a DRAM are formed in the non-SOI region formed by use of the above manufacturing method, the active region of the device crosses the formation interface 16A of the silicon layer 16 so as to significantly increase the leakage current and degrade the pause characteristic and a desired electrical characteristic cannot be attained.

FIG. 3 is a cross-sectional view of a trench type memory cell MC of a DRAM and shows leakage current paths. The memory cell MC is configured by a cell transistor CT and a cell capacitor (trench capacitor) CC. A gate electrode 23 is formed above part of the silicon layer 16 which lies between a source region 21 and a drain region 22 of the cell transistor CT with a gate insulating film 24 disposed therebetween. As shown in FIG. 3, the source region 21, drain region 22 and depletion layer 25 of the cell transistor CT cross the formation interface 16A of the silicon layer 16.

At the OFF time of the cell transistor CT, a leakage current Ioff flows between the source region 21 and the drain region 22. Further, a junction leakage current Ij flows through a junction between the source region 21 and the supporting substrate 12.

Thus, in the semiconductor device using the conventional partial SOI substrate and the manufacturing method thereof, the leakage current increases to a large extent and the pause characteristic is considerably degraded.

BRIEF SUMMARY OF THE INVENTION

According to an aspect of the present invention, there is provided a semiconductor device comprising a first semiconductor layer formed above a first region of a supporting substrate with a buried oxide layer disposed therebetween, and a second semiconductor layer formed on a second region of the supporting substrate, wherein an interface between the supporting substrate and the semiconductor layer is placed in substantially the same depth position as the undersurface of the buried oxide layer or in a position deeper than the buried oxide layer.

According to an aspect of the present invention, there is provided a semiconductor device manufacturing method comprising selectively removing portions of a buried oxide layer and first semiconductor layer on an SOI substrate having the first semiconductor layer formed above a semiconductor substrate with the buried oxide layer disposed therebetween and exposing part of the semiconductor substrate, removing an exposed region of the semiconductor substrate in a depth direction, and burying a second semiconductor region in the region from which part of the semiconductor substrate has been removed in the depth direction.

According to another aspect of the present invention, there is provided a semiconductor device manufacturing method comprising selectively removing portions of a buried oxide layer and first semiconductor layer on an SOI substrate having the first semiconductor layer formed above a semiconductor substrate with the buried oxide layer disposed therebetween, forming a sidewall protection film on a sidewall of the first semiconductor layer, removing a portion of the remaining buried oxide layer and exposing the surface of the semiconductor substrate, and forming a second semiconductor layer on the exposed surface of the semiconductor substrate.

DETAILED DESCRIPTION OF THE INVENTION

[First Embodiment]

Figure 1A:
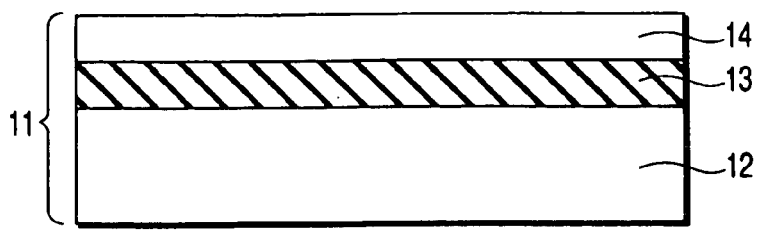
FIGS. 1A to 1D are cross-sectional views sequentially showing manufacturing steps in order, for illustrating the conventional semiconductor device manufacturing method.
Figure 1B:
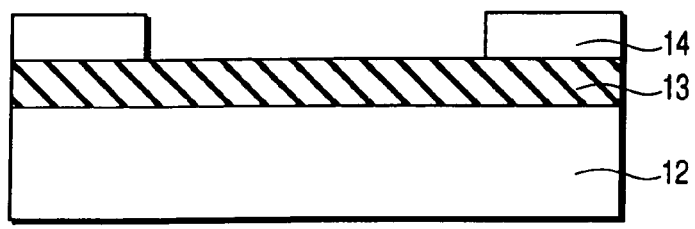
Figure 1C:
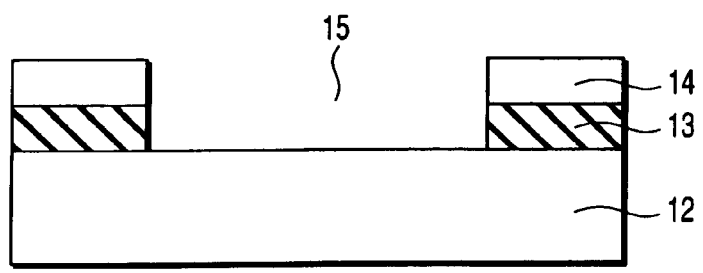
Figure 1D:
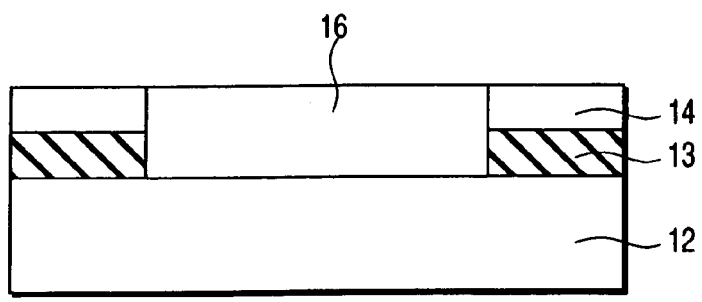
Figure 2:
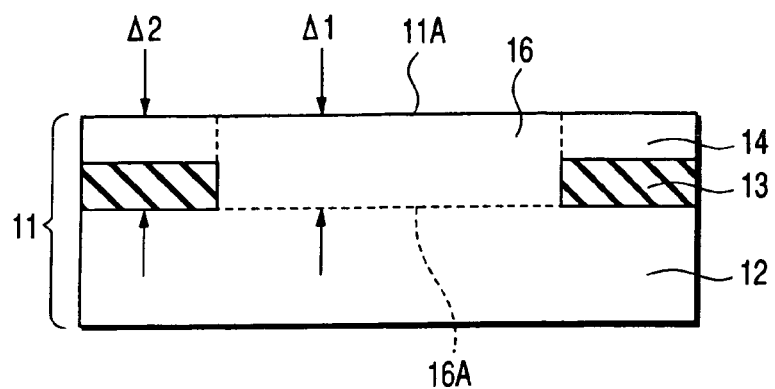
FIG. 2 is a cross-sectional view showing a partial SOI substrate formed by use of the conventional method.
Figure 3:
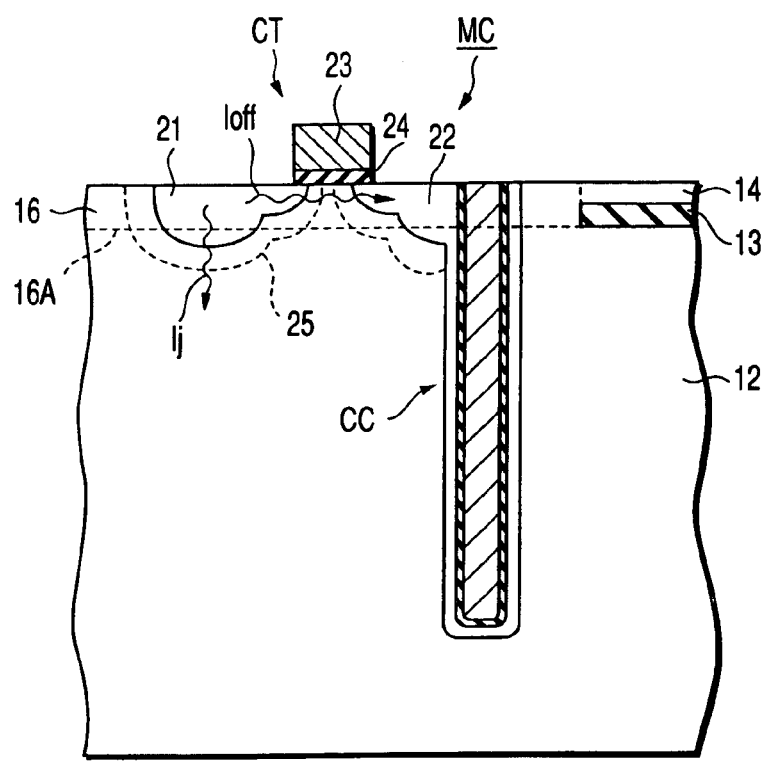
FIG. 3 a cross-sectional view of a trench type memory cell of a DRAM, for illustrating leakage current paths.
Figure 4:
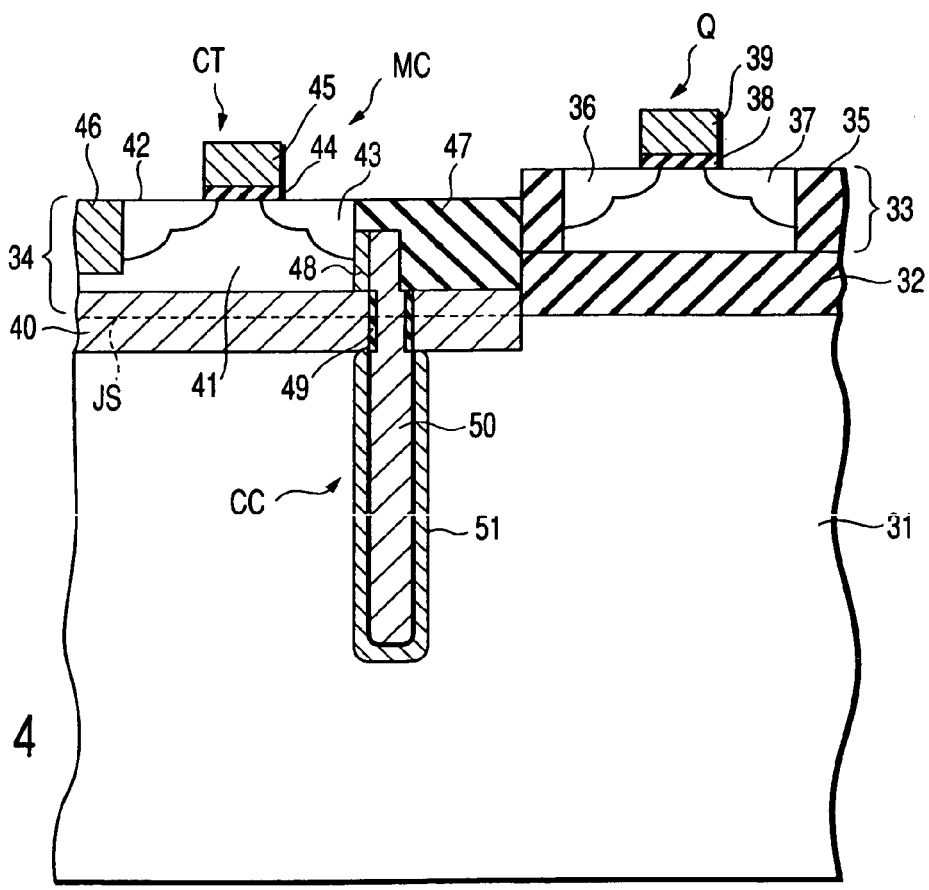
FIG. 4 is a cross-sectional view for illustrating a semiconductor device according to a first embodiment of this invention.

FIG. 4 is a cross-sectional view for illustrating a semiconductor device according to a first embodiment of this invention. In FIG. 4, a case wherein MOSFETs configuring a DRAM (trench type memory cells) and a logic circuit are formed together is shown as an example.

A buried oxide layer (BOX layer) 32 is formed on a supporting substrate (silicon substrate) 31 and a silicon layer (SOI layer) 33 is formed on the buried oxide layer 32 to form an SOI region. Further, an epitaxial silicon layer 34 is formed on a region (non-SOI region or bulk region) in which the buried oxide layer 32 does not exist on the supporting substrate 31. The interface JS between the supporting substrate 31 and the epitaxial silicon layer 34 is set at substantially the same height as the undersurface of the buried oxide layer 32. Further, the upper surface of the epitaxial silicon layer 34 is set lower than the upper surface of the SOI layer 33 and higher than the upper surface of the buried oxide layer 32.

A MOSFET Q configuring the logic circuit is formed in the SOI region in which the buried oxide layer 32 is formed and a trench type memory cell MC of the DRAM is formed in the non-SOI region in which the buried oxide layer 32 is not formed.

The MOSFET Q is formed in a region of the SOI layer 33 which is defined by an element isolation region 35 of STI structure. That is, a source region 36 and a drain region 37 are separately formed in the SOI layer 33. A gate insulating film 38 is formed on part of the SOI layer 33 which lies between the source region 36 and the drain region 37 and a gate electrode 39 is formed on the gate insulating film 38.

On the other hand, the memory cell MC configured by a cell transistor CT and a cell capacitor (trench capacitor) CC is formed in the supporting substrate 31 and epitaxial silicon layer 34. A buried n-well region 40 is formed near the junction (indicated by broken lines JS) between the supporting substrate 31 and the epitaxial silicon layer 34. A source region 42 and drain region 43 of the cell transistor CT are separately formed in a p-well region 41 which is formed on the n-well region 40. A gate insulating film 44 is formed on part of the epitaxial silicon layer 34 which lies between the source region 42 and the drain region 43 and a gate electrode 45 is formed on the gate insulating film 44. Further, in the epitaxial silicon layer 34, a source electrode 46 is buried and formed in contact with the source region 42 and an element isolation region 47 is formed on the drain region 43 side. A buried strap 48 is formed between the drain region 43 and the element isolation region 47. Further, a collar oxide film 49 is formed in the buried n-well region 40. A polysilicon layer 50 is buried or filled in the trench of the cell capacitor CC with an oxide film disposed therebetween. An impurity diffusion layer 51 is formed in part of the supporting substrate 31 which lies around the trench. The polysilicon layer 50 acts as one electrode of the cell capacitor CC and the impurity diffusion layer 51 acts as the other electrode.

As shown in FIG. 4, the interface JS between the supporting substrate 31 and the epitaxial silicon layer 34 is formed to cross the collar oxide film 49 without crossing the active region of the element, that is, the source region 42, drain region 43 and buried strap 48 of the cell transistor CT and the impurity diffusion layer 51 of the cell capacitor CC.

With the above structure, a depletion layer and impurity diffusion layers used as the source region 42, drain region 43 of the cell transistor CT and the impurity diffusion layer 51 of the cell capacitor CC do not extend to the interface JS between the supporting substrate 31 and the epitaxial silicon layer 34. As a result, an increase in the leakage current and a degradation in the pause characteristic can be suppressed and the electrical characteristic of a device formed on the non-SOI region of the partial SOI substrate can be enhanced.

[Second Embodiment]

Figure 5:
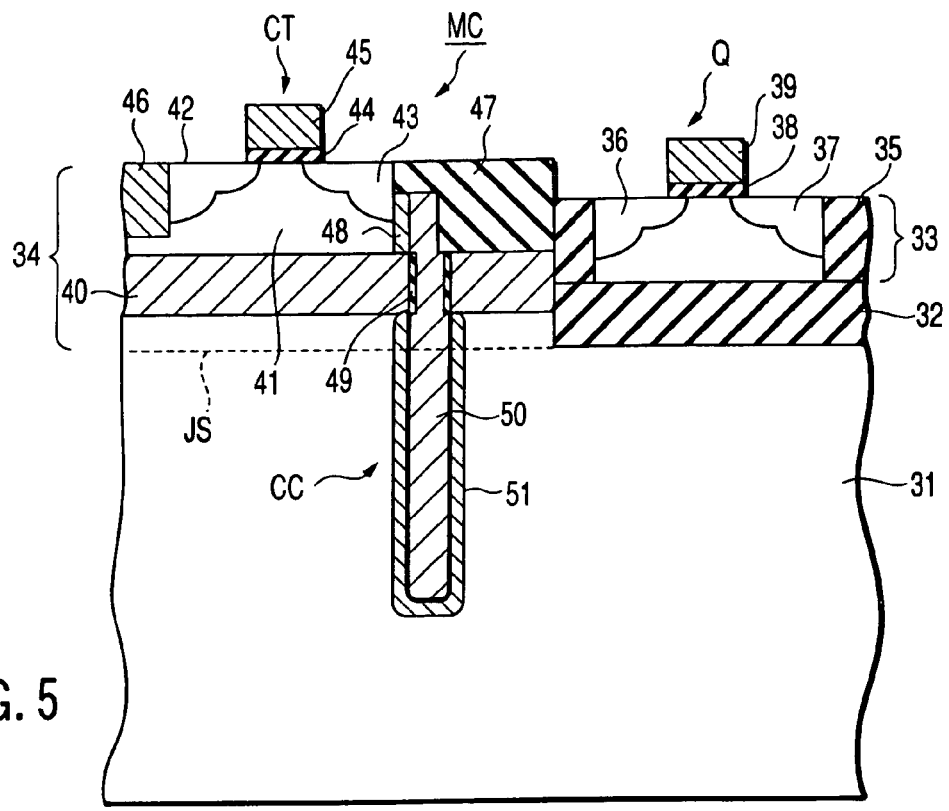
FIG. 5 is a cross-sectional view for illustrating a semiconductor device according to a second embodiment of this invention.

FIG. 5 is a cross-sectional view for illustrating a semiconductor device according to a second embodiment of this invention. In FIG. 5, like the first embodiment, a case wherein MOSFETs configuring a DRAM (trench type memory cells) and a logic circuit are formed together is shown as an example.

A buried oxide layer (BOX layer) 32 is formed on a supporting substrate (silicon substrate) 31 and a silicon layer (SOI layer) 33 is formed on the buried oxide layer 32 to form an SOI region. Further, an epitaxial silicon layer 34 is formed on a region (non-SOI region or bulk region) in which the buried oxide layer 32 does not exist on the supporting substrate 31. The interface JS between the supporting substrate 31 and the epitaxial silicon layer 34 is set at substantially the same height as the undersurface of the buried oxide layer 32. Further, the upper surface of the epitaxial silicon layer 34 is set higher than the upper surface of the SOI layer 33.

Since the other basic structure is the same as that shown in FIG. 4, the same reference numerals are attached to like portions and the detailed explanation thereof is omitted. That is, in the semiconductor device according to the second embodiment, a cell transistor CT and a cell capacitor CC are formed so that the interface JS between the supporting substrate 31 and the epitaxial silicon layer 34 will cross the cell capacitor CC without crossing the source region 42, drain region 43 and buried strap 48 of the cell transistor CT.

With the above structure, a depletion layer and impurity diffusion layers used as the source region 42, drain region 43 of the cell transistor CT can be formed so as not to extend to the interface JS between the supporting substrate 31 and the epitaxial silicon layer 34. As a result, the leakage current can be reduced and the electrical characteristic of a device formed on the non-SOI region of the partial SOI substrate can be enhanced.

[Third Embodiment]

Figure 6:
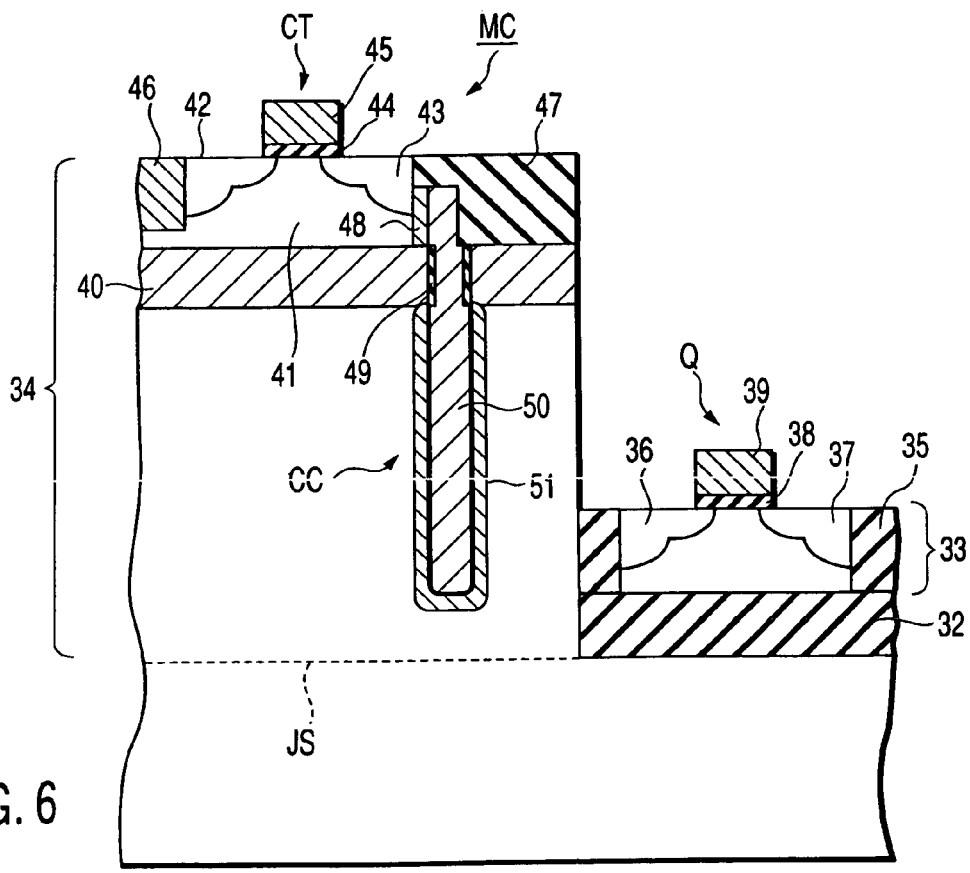
FIG. 6 is a cross-sectional view for illustrating a semiconductor device according to a third embodiment of this invention.

FIG. 6 is a cross-sectional view for illustrating a semiconductor device according to a third embodiment of this invention. In FIG. 6, like the first embodiment, a case wherein MOSFETs configuring a DRAM (trench type memory cells) and a logic circuit are formed together is shown as an example.

A buried oxide layer (BOX layer) 32 is formed on a supporting substrate (silicon substrate) 31 and a silicon layer (SOI layer) 33 is formed on the buried oxide layer 32 to form an SOI region. Further, an epitaxial silicon layer 34 is formed on a region (non-SOI region or bulk region) in which the buried oxide layer 32 does not exist on the supporting substrate 31. The interface JS between the supporting substrate 31 and the epitaxial silicon layer 34 is set at substantially the same height as the undersurface of the buried oxide layer 32. Further, the upper surface of the epitaxial silicon layer 34 is set sufficiently higher than the upper surface of the SOI layer 33.

Since the other basic structure is the same as those shown in FIGS. 4 and 5, the same reference numerals are attached to like portions and the detailed explanation thereof is omitted. That is, in the semiconductor device according to the third embodiment, a cell transistor CT and a cell capacitor CC are formed so that the interface JS between the supporting substrate 31 and the epitaxial silicon layer 34 will cross none of the source region 42, drain region 43 and buried strap 48 of the cell transistor CT and an impurity diffusion layer 51 of the cell capacitor CC.

With the above structure, a depletion layer and impurity diffusion layers used as the source region 42, drain region 43 of the cell transistor CT and the impurity diffusion layer 51 of the cell capacitor CC can be formed so as not to extend to the interface JS between the supporting substrate 31 and the epitaxial silicon layer 34. As a result, an increase in the leakage current and a degradation in the pause characteristic can be suppressed and the electrical characteristic of a device formed on the non-SOI region of the partial SOI substrate can be enhanced.

[Fourth Embodiment]

Figure 7:
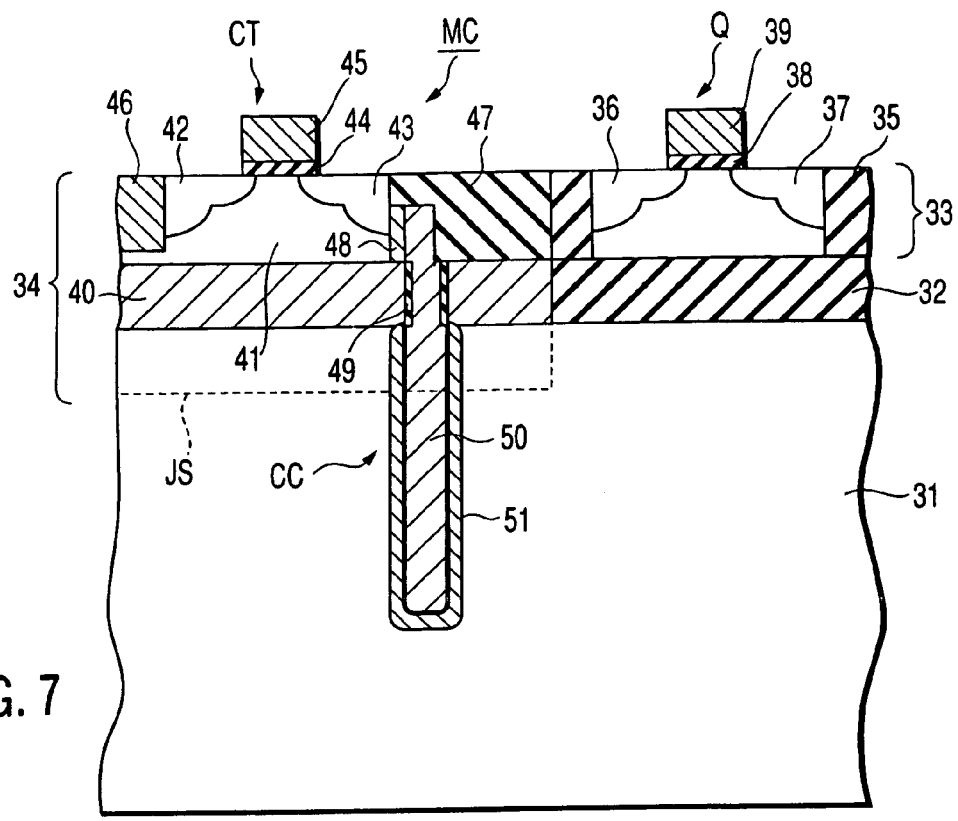
FIG. 7 is a cross-sectional view for illustrating a semiconductor device according to a fourth embodiment of this invention.

FIG. 7 is a cross-sectional view for illustrating a semiconductor device according to a fourth embodiment of this invention. In FIG. 7, like the first to third embodiments, a case wherein MOSFETs configuring a DRAM (trench type memory cells) and a logic circuit are formed together is shown as an example.

A buried oxide layer (BOX layer) 32 is formed on a supporting substrate (silicon substrate) 31 and a silicon layer (SOI layer) 33 is formed on the buried oxide layer 32 to form an SOI region. Further, an epitaxial silicon layer 34 is formed starting from the surface of a deeply removed portion of the supporting substrate 31 on a region (non-SOI region or bulk region) in which the buried oxide layer 32 does not exist on the supporting substrate 31. That is, the interface JS between the supporting substrate 31 and the epitaxial silicon layer 34 is set in a position deeper than the buried oxide layer 32. Further, the upper surface of the epitaxial silicon layer 34 is set at substantially the same height as the upper surface of the SOI layer 33.

Since the other basic structure is the same as those shown in FIGS. 4 to 6, the same reference numerals are attached to like portions and the detailed explanation thereof is omitted. That is, in the semiconductor device according to the fourth embodiment, a cell transistor CT and a cell capacitor CC are formed so that the interface JS between the supporting substrate 31 and the epitaxial silicon layer 34 will cross the cell capacitor CC without crossing the source region 42, drain region 43 and buried strap 48 of the cell transistor CT.

With the above structure, a depletion layer and impurity diffusion layers used as the source region 42, drain region 43 of the cell transistor CT can be formed so as not to extend to the interface JS between the supporting substrate 31 and the epitaxial silicon layer 34. As a result, the leakage current can be reduced and the electrical characteristic of a device formed on the non-SOI region of the partial SOI substrate can be enhanced. Further, since the surfaces of the SOI region and non-SOI region can be set at substantially the same height, occurrence of a failure due to breakage of an interconnection layer formed on the above regions can be suppressed.

[Fifth Embodiment]

Figure 8:
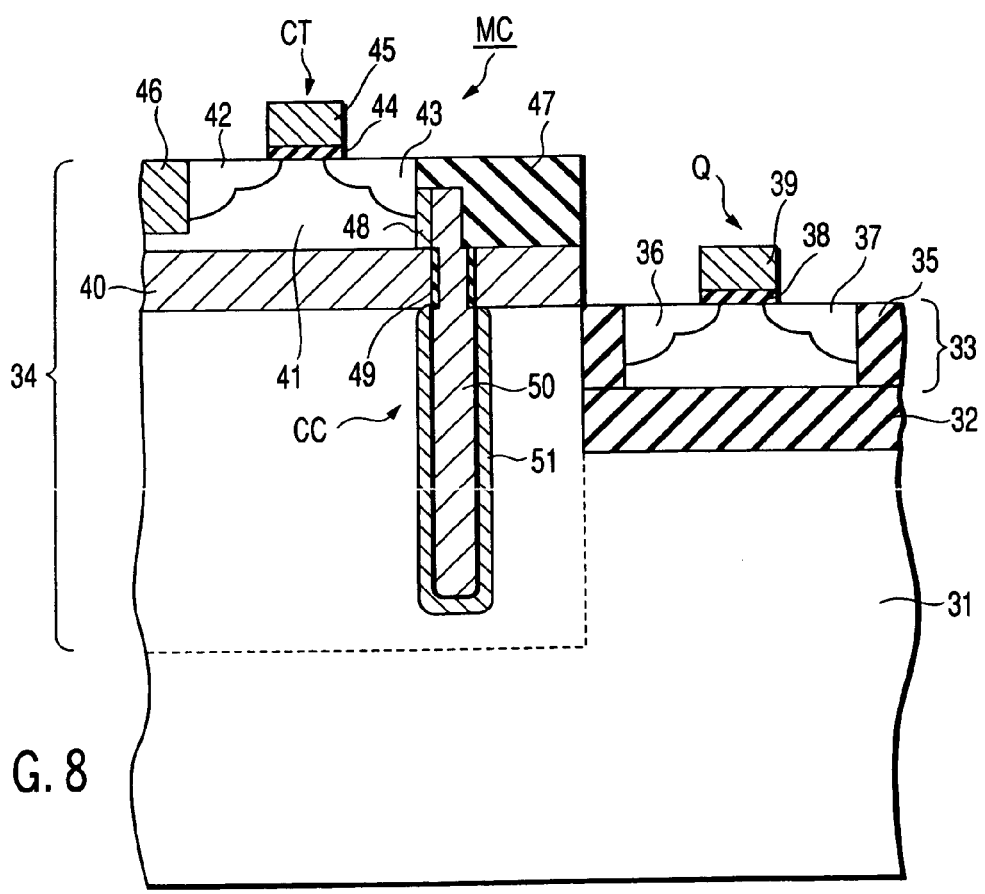
FIG. 8 is a cross-sectional view for illustrating a semiconductor device according to a fifth embodiment of this invention.

FIG. 8 is a cross-sectional view for illustrating a semiconductor device according to a fifth embodiment of this invention. In FIG. 8, like the first to fourth embodiments, a case wherein MOSFETs configuring a DRAM (trench type memory cells) and a logic circuit are formed together is shown as an example.

A buried oxide layer (BOX layer) 32 is formed on a supporting substrate (silicon substrate) 31 and a silicon layer (SOI layer) 33 is formed on the buried oxide layer 32 to form an SOI region. Further, an epitaxial silicon layer 34 is formed starting from the surface of a sufficiently deeply removed portion of the supporting substrate 31 on a region (non-SOI region or bulk region) in which the buried oxide layer 32 does not exist on the supporting substrate 31. The interface JS between the supporting substrate 31 and the epitaxial silicon layer 34 is set in a position sufficiently deeper than the buried oxide layer 32. Further, the upper surface of the epitaxial silicon layer 34 is set sufficiently higher than the upper surface of the SOI layer 33.

Since the other basic structure is the same as those shown in FIGS. 4 to 7, the same reference numerals are attached to like portions and the detailed explanation thereof is omitted. That is, in the semiconductor device according to the fifth embodiment, a cell transistor CT and a cell capacitor CC are formed so that the interface JS between the supporting substrate 31 and the epitaxial silicon layer 34 will cross none of the source region 42, drain region 43 and buried strap 48 of the cell transistor CT and an impurity diffusion layer 51 of the cell capacitor CC.

With the above structure, a depletion layer and diffusion layers used as the source region 42, drain region 43 of the cell transistor CT and the diffusion layer of the cell capacitor CC can be formed so as not to extend to the interface JS between the supporting substrate 31 and the epitaxial silicon layer 34. As a result, an increase in the leakage current and a degradation in the pause characteristic can be suppressed and the electrical characteristic of a device formed on the non-SOI region of the partial SOI substrate can be enhanced. Further, since the difference in level of the surfaces of the SOI region and non-SOI region can be suppressed, a failure due to breakage of an interconnection layer formed on the regions can be suppressed.

[Sixth Embodiment]

Next, a manufacturing method of the semiconductor device described above is explained in detail with reference to FIGS. 9A to 9E.

Figure 9A:
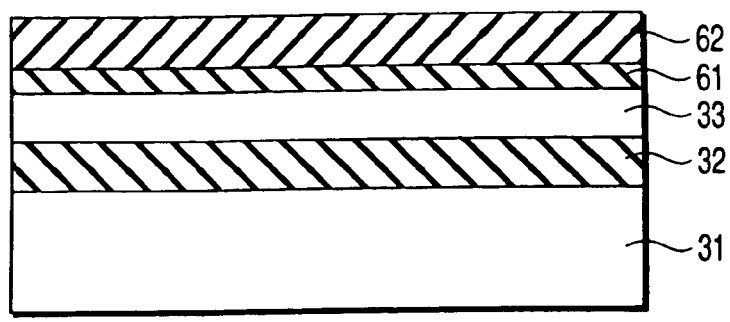
FIGS. 9A to 9E are cross-sectional views sequentially showing manufacturing steps in order, for illustrating a semiconductor device manufacturing method according to a sixth embodiment of this invention.

First, as shown in FIG. 9A, an SOI substrate is formed by bonding a silicon substrate (supporting substrate) 31, BOX layer 32 and SOI layer 33 by use of the wafer bonding method. Of course, it is possible to form the BOX layer 32 on the silicon substrate (supporting substrate) 31 and then form the SOI layer 33 on the BOX layer 32 instead of using the wafer bonding method.

Then, a protection oxide film 61 is formed on the SOI layer and an SiN layer 62 is formed on the protection oxide layer 61. At this time, the thickness of the BOX layer 32 is set to approx. 400 nm and the thickness of the SOI layer is set to approx. 200 nm.

Figure 9B:
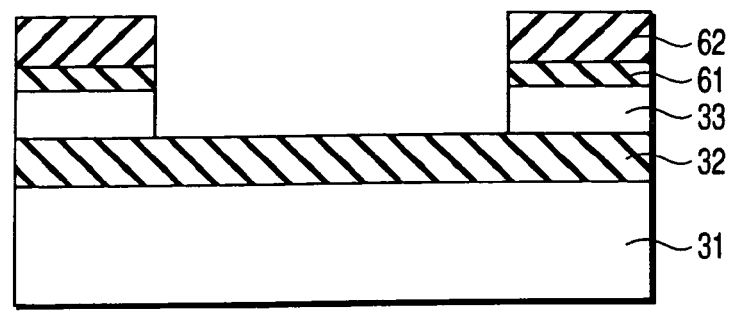

After this, the SiN layer 62 is patterned by use of PEP to partly remove the SiN layer. As shown in FIG. 9B, the protection oxide film 61 and SOI layer 33 are selectively removed with the patterned SiN layer 62 used as a mask. In this case, for removal of the layers, the dry-etching process is used.

Figure 9C:
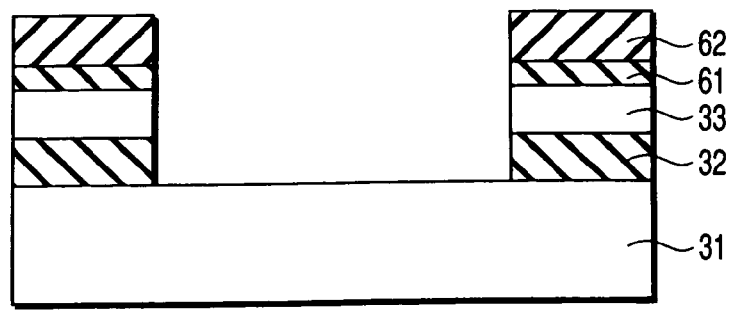

Then, with the SiN layer 62 used as a mask, the BOX layer 32 is selectively removed to expose the surface of the silicon substrate 31 (FIG. 9C). In order to remove the BOX layer 32, a wet etching process using a solution is used, but a dry-etching process by plasma can also be used.

Figure 9D:
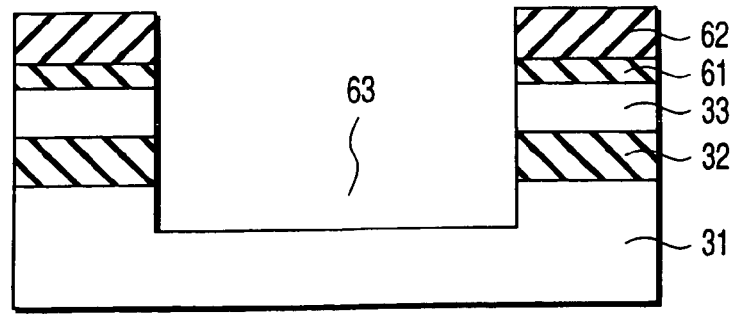

Next, as shown in FIG. 9D, the silicon substrate 31 is removed to a depth of approx. 1 μm by etching to form a stepped portion 63 which is used to form a non-SOI region. As the etching process of the silicon substrate 31, a wet etching process using a solution which gives less damage is used.

Figure 9E:
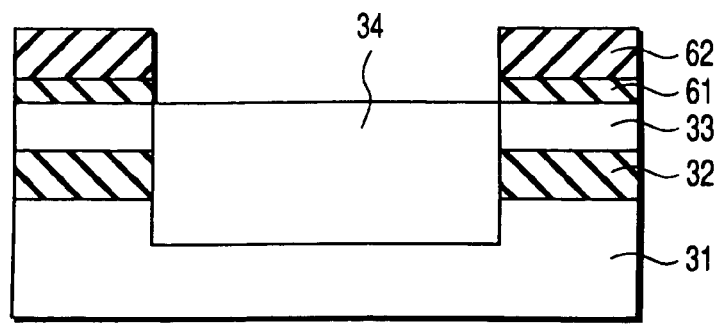

After this, as shown in FIG. 9E, a silicon layer 34 is formed so as to be buried in the stepped portion 63. A selective epitaxial growth method is used for formation of the silicon layer 34. For example, the selective epitaxial growth method of the silicon layer 34 is performed by using $SiH_2Cl_2$ and HCL as material gas and $H_2$ as carrier gas in a condition that the growth pressure is $6.7 \times 10^3$ Pa and the growth temperature is 1000° C. The thickness of the buried silicon layer 34 is 1.6 μm and the upper surface thereof is set at substantially the same height as the upper surface of the SOI layer 33.

Then, the protection oxide film 61 and SiN layer 62 used as the mask are removed to terminate the manufacturing process of the partial SOI substrate.

After this, MOSFETs configuring a logic circuit are formed in the SOI layer 33 and trench type memory cells are formed in the silicon layer 34 by a known manufacturing process.

According to the above manufacturing method, a semiconductor device with the structure shown in FIG. 7 can be obtained.

Figure 10:
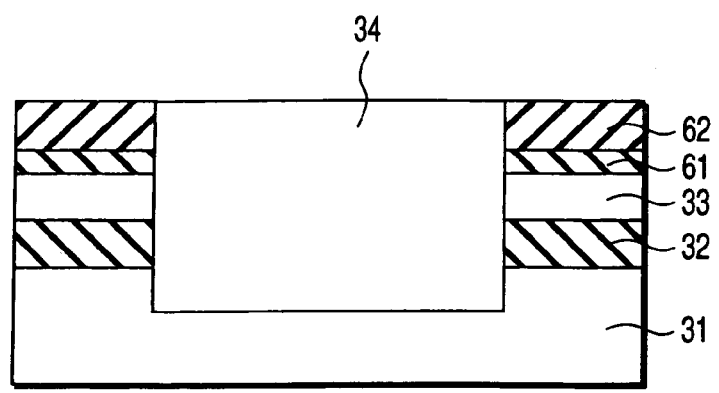
FIG. 10 is a cross-sectional view for illustrating another example of the semiconductor device manufacturing method according to the sixth embodiment of this invention.

Further, as shown in FIG. 10, if the thickness of the buried silicon layer 34 is set to 1.8 μm, for example, the upper surface of the silicon layer 34 is set higher than the upper surface of the SOI layer 33 and a semiconductor device with the structure shown in FIG. 8 can be obtained.

Figure 11:
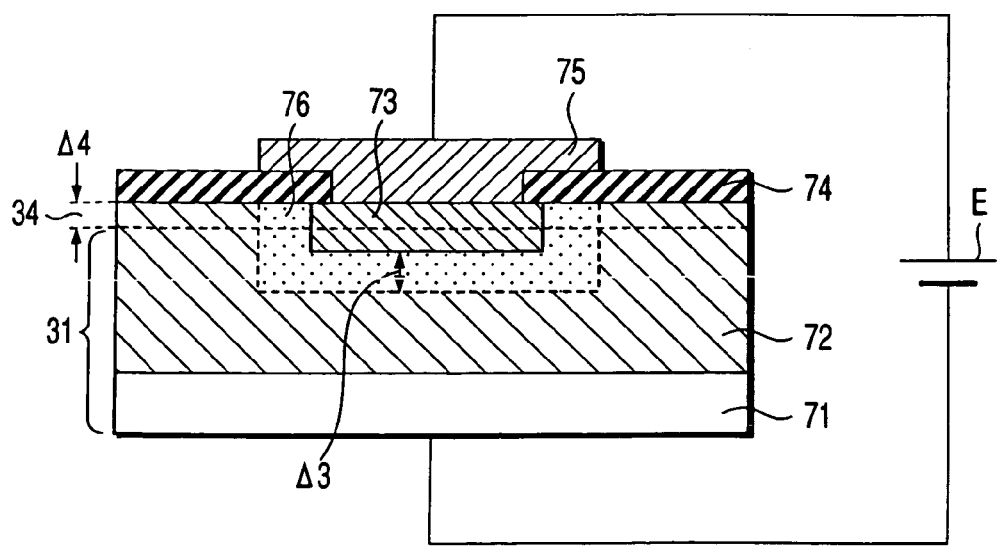
FIG. 11 is a cross-sectional view of a diode used to evaluate the electrical characteristic of a non-SOI region.

In order to evaluate the electrical characteristic of the non-SOI region formed by the above method, 112 diodes having the same structure as a diode as shown in FIG. 11 were formed in the substrate surface and the evaluation of the junction leakage characteristic was carried out. In the diode, a p-type well region 72 formed on the surface of a p-type semiconductor region 71 acts as an anode and an n-type impurity diffusion layer 73 acts as a cathode. An element isolation oxide film 74 is formed on the p-type well region 72 and an Al electrode 75 is electrically connected to the n-type impurity diffusion layer 73 via an opening formed in the element isolation oxide film 74 in a position corresponding to the n-type impurity diffusion layer 73. Reverse bias voltage is applied to the diode from a DC power supply E to form a depletion layer 76 therein.

In this example, the thickness Δ4 of the epitaxial silicon layer 34 formed on the silicon substrate 31 is changed.

Diodes used for evaluation of the electrical characteristics were each formed by use of the following process. First, a p-type well region 72 with the impurity concentration of $5.0 \times 10^{17}$ atoms/cm³ was formed to a depth of approx. 1.0 μm on a p-type silicon substrate 31 with a resistivity of 1 to 2 Ωcm by ion implantation. Then, an n-type impurity diffusion layer 73 with an impurity concentration of $1.0 \times 10^{18}$ to $1.0 \times 10^{20}$ atoms/cm³ and the junction area of 1.0 mm² was formed to a junction depth of 0.2 μm in the p-type well region 72 by ion implantation. After this, an element isolation oxide film 74 was formed by use of TEOS and an Al electrode 75 was finally formed to complete a diode.

As the electrical characteristic, the presence or absence of a leakage current when reverse bias voltages of 2 V and 4 V were applied to the diode was evaluated. At this time, it was confirmed that the depletion layer 76 was extended by approx. 0.25 μm and 0.4 μm, respectively.

Figure 12:
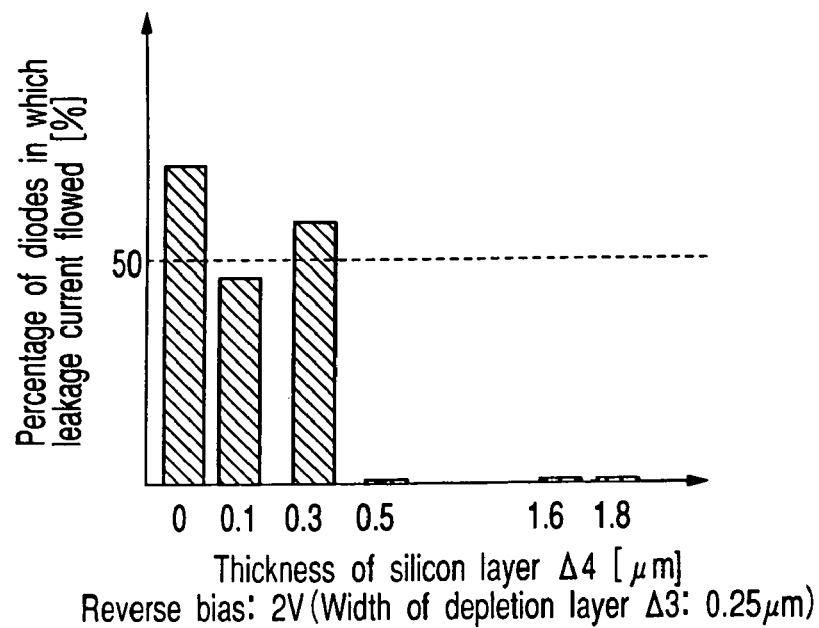
FIG. 12 is a characteristic diagram showing the percentage of diodes in which a leakage current flows.
Figure 13:
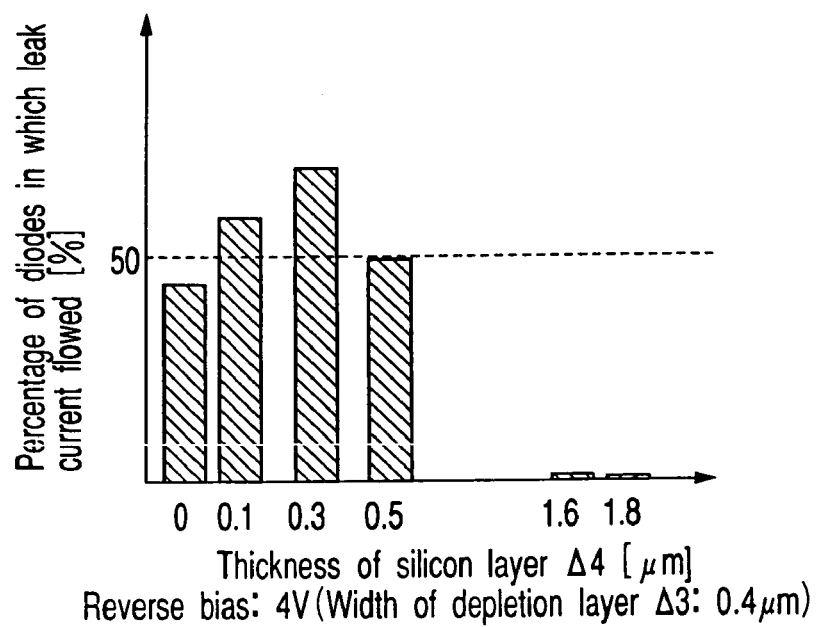
FIG. 13 is a characteristic diagram showing the percentage of diodes in which a leakage current flows.

First, the percentage of diodes in which leakage currents flowed with respect to all of the diodes was evaluated. The percentage of diodes in which leakage currents flowed is shown in FIGS. 12 and 13. For comparison, a case wherein samples in which the thickness Δ4 of the silicon layer 34 is set at 0, 0.1, 0.3 and 0.5 μm are used is also shown. As a result, it was confirmed that the percentage of diodes in which leakage currents flowed with respect to the diodes each formed in the non-SOI region (the thickness of the silicon layer is 1.6, 1.8 μm) according to this invention was as small as 2% or less. However, among the samples in which the thickness Δ4 of the silicon layer 34 was set at 0 to 0.3 μm, leakage currents flowed in the diodes of approx. 50% irrespective of the magnitude of the reverse bias voltage (magnitude of the width of the depletion layer Δ3). Further, among the samples in which the thickness Δ4 of the silicon layer was set at 0.5 μm, leakage currents flowed in the diodes of only approx. 2% when the reverse bias voltage was 2 V (the width of the depletion layer Δ3=0.25 μm) and leakage currents flowed in the diodes of approx. 50% when the reverse bias voltage was 4 V (the width of the depletion layer Δ3=0.4 μm).

Figure 14:
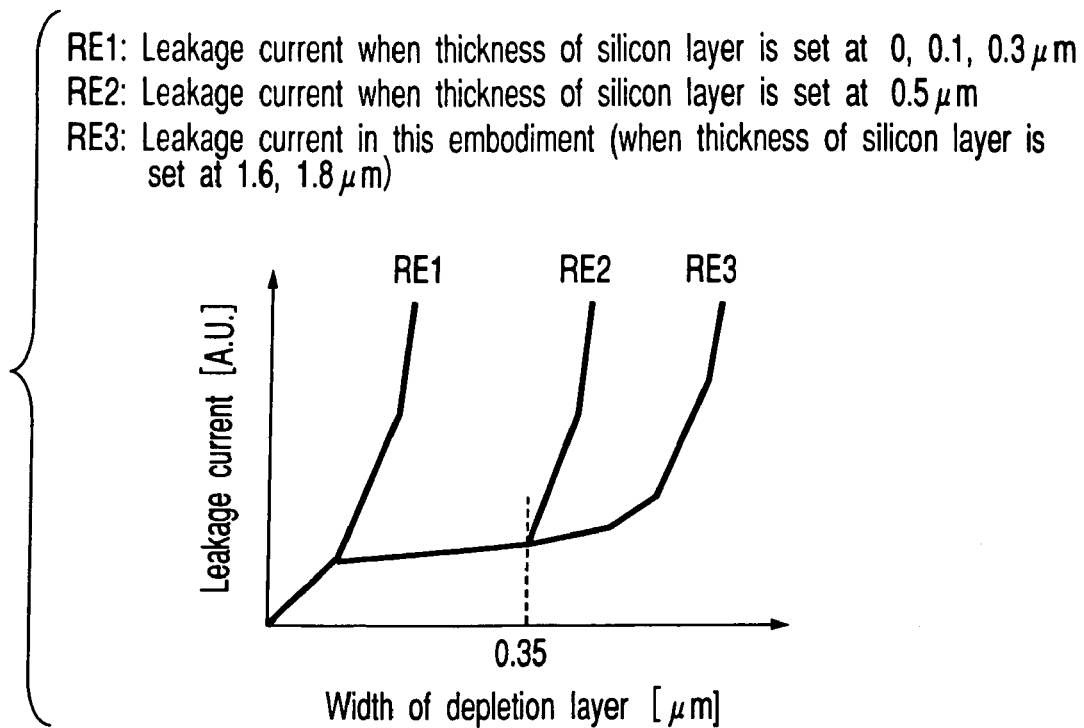
FIG. 14 is a diagram showing the relation between the leakage current and the width of a depletion layer.
Figure 15:
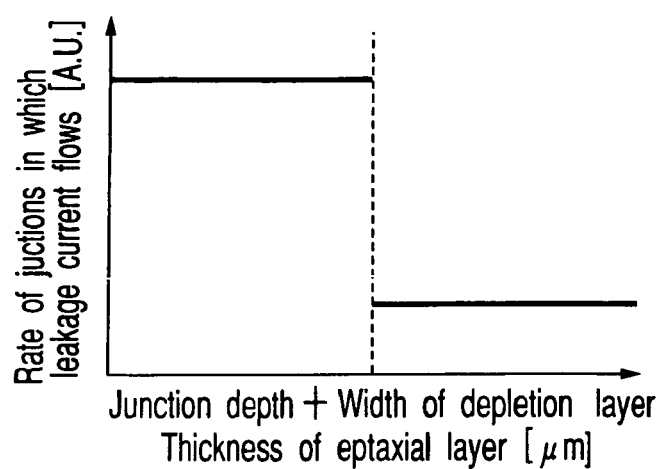
FIG. 15 is a diagram showing the relation between the thickness of a silicon layer and the leakage current.

The relation between the leakage current and the width of the depletion layer is shown in FIG. 14. As is clearly seen from FIG. 14, the leakage current may flow in some cases when the formation interface JS of the silicon layer 34 crosses the impurity diffusion layer or depletion layer. The relation between the thickness Δ4 of the silicon layer 34 and the leakage current obtained by the experiment is shown in FIG. 15.

It is understood from the above result that the leakage current can be suppressed and a partial SOI substrate of high quality with an excellent electrical characteristic can be formed by preventing the formation interface JS of the silicon layer 34 from extending to the impurity diffusion layer or depletion layer of the device when the partial SOI substrate having a non-SOI region is formed.

[Seventh Embodiment]

FIGS. 16A to 16H show another manufacturing method of a semiconductor device. In the present embodiment, a sidewall protection film is formed after the stepped portion is formed in the manufacturing method of the semiconductor device according to the sixth embodiment. By forming the sidewall protection film, growth of silicon from the SOI layer exposed to the sidewall of the stepped portion can be suppressed and formation of a bump on the boundary between the non-SOI region and the SOI region on the substrate surface can be suppressed.

That is, the steps shown in FIGS. 16A to 16D are the same as those of FIGS. 9A to 9D in the sixth embodiment. Therefore, the same reference numerals are attached to like potions and the detailed explanation thereof is omitted.

Figure 16A:
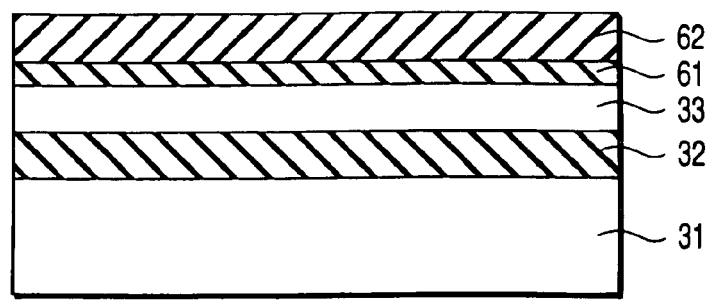
FIGS. 16A to 16H are cross-sectional views sequentially showing manufacturing steps in order, for illustrating a semiconductor device manufacturing method according to a seventh embodiment of this invention.
Figure 16B:
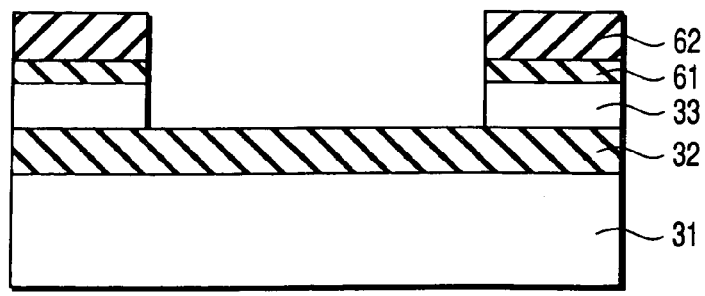
Figure 16C:
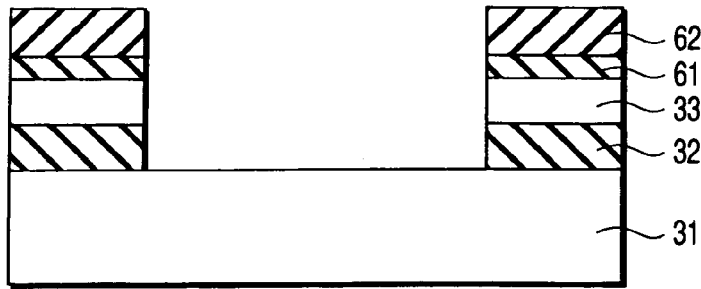
Figure 16D:
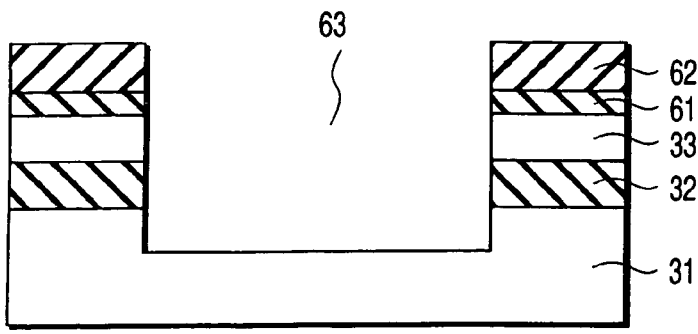
Figure 16E:
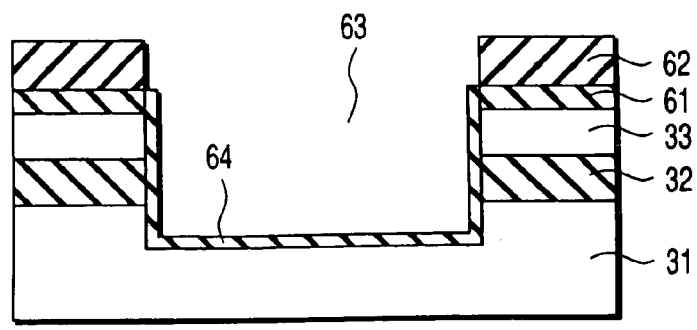

Next, as shown in FIG. 16E, an oxide film 64 is formed on the exposed surfaces of the silicon substrate 31 and SOI layer 33. The thermal oxidation method is used for formation of the oxide film 64.

Figure 16F:
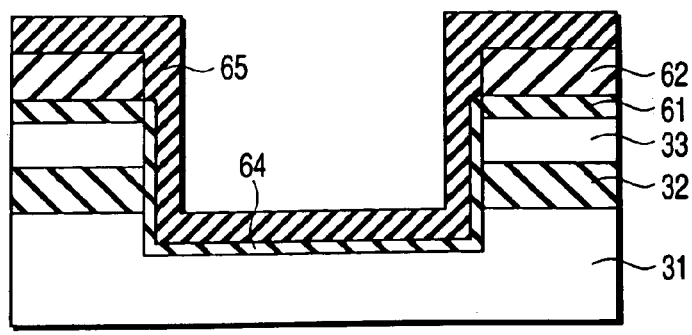

Then, as shown in FIG. 16F, a sidewall protection film 65 is formed. SiN is used to form the sidewall protection film 65.

Figure 16G:
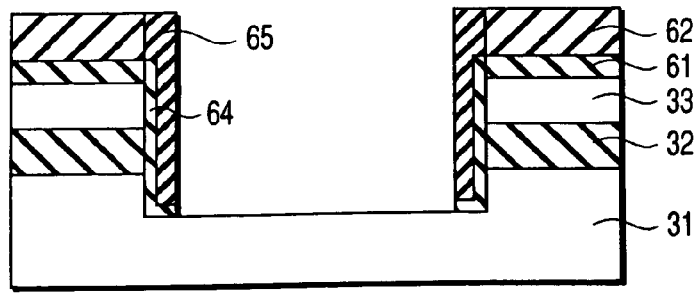
Figure 16H:
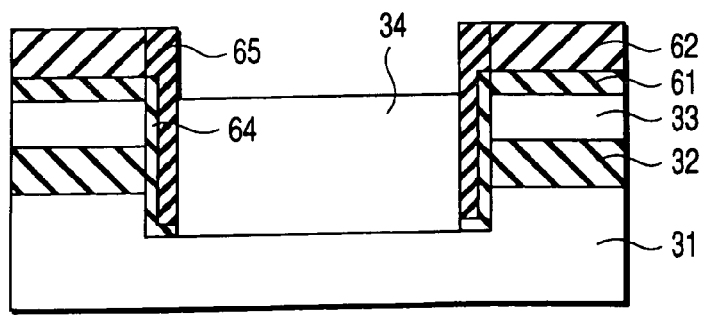

After this, as shown in FIG. 16G, part of the SiN film 65 except the sidewall thereof is removed. For removal of part of the SiN film 65 except the sidewall thereof, an etching method using plasma which is an anisotropic etching method is used. Then, part of the oxide film 64 which lies on the surface of the silicon substrate 31 is etched and removed and formation of the stepped portion 63 is terminated. In this case, for the etching process, a wet etching process which gives less damage is used.

Next, a silicon layer 34 is formed so as to be buried or filled in the stepped portion 63. The film formation condition of the silicon layer 34 is the same as that of the sixth embodiment.

Then, the protection oxide film 61 and SiN layer 62 on the SOI layer 33 are removed and formation of the partial SOI substrate is terminated.

After this, MOSFETs configuring a logic circuit are formed in the SOI layer 33 and trench type memory cells are formed in the silicon layer 34.

According to the above manufacturing method, a semiconductor device with the structure as shown in FIG. 7 can be obtained.

The electrical characteristic of the non-SOI region formed by the above method was evaluated in the same manner as that in the sixth embodiment. As a result, with the manufacturing method according to the seventh embodiment, the percentage of diodes in which leakage currents flowed was 2% or less and a partial SOI substrate of high quality could be obtained.

Figure 17:
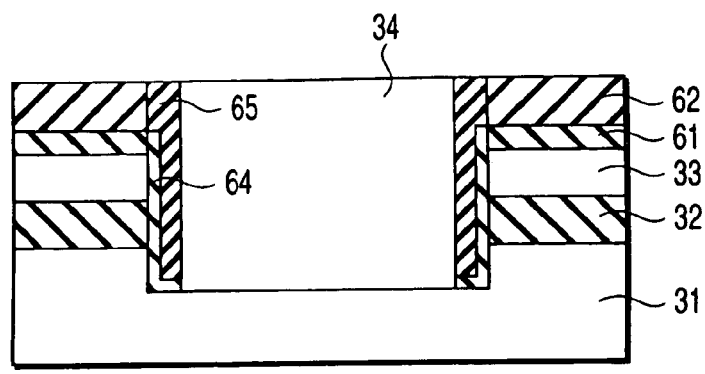
FIG. 17 is a cross-sectional view for illustrating another example of the semiconductor device manufacturing method according to the seventh embodiment of this invention.

Further, as shown in FIG. 17, if the thickness of the silicon layer 34 is set to 1.8 μm, for example, when it is buried in the stepped portion 63, the upper surface of the silicon layer 34 is set higher than the upper surface of the SOI layer 33 and a semiconductor device with the structure as shown in FIG. 8 can be obtained.

[Eighth Embodiment]

FIGS. 18A to 18G show still another manufacturing method of a semiconductor device. In the present embodiment, a structure in which a silicon layer is buried without removing a silicon substrate by etching is formed and the thickness thereof is larger than the sum of the thicknesses of a BOX layer and SOI layer.

Figure 18A:
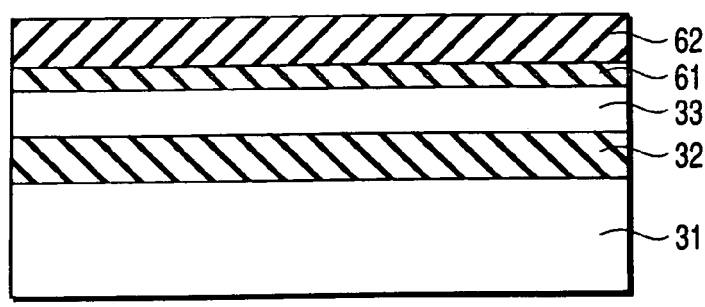
FIGS. 18A to 18G are cross-sectional views sequentially showing manufacturing steps in order, for illustrating a semiconductor device manufacturing method according to an eighth embodiment of this invention.
Figure 18B:
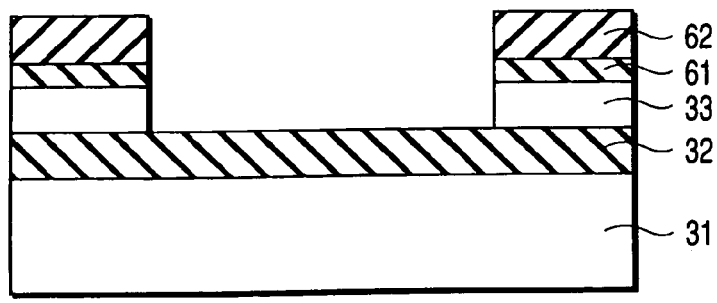

That is, the steps shown in FIGS. 18A and 18B are the same as those of FIGS. 16A and 16B in the seventh embodiment. Therefore, the same reference numerals are attached to like potions and the detailed explanation thereof is omitted.

Figure 18C:
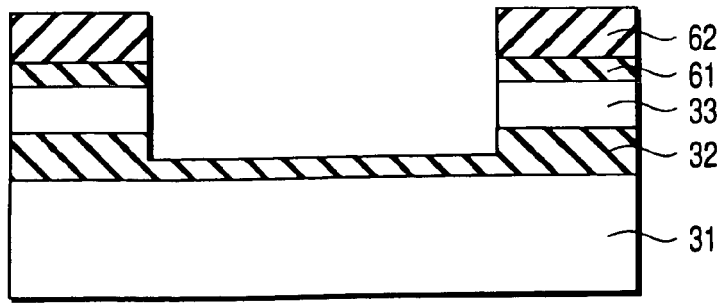

Next, as shown in FIG. 18C, part of a BOX layer 32 is removed. For removal of the BOX layer 32, a dry-etching process using plasma or a wet etching process using a solution is used.

Figure 18D:
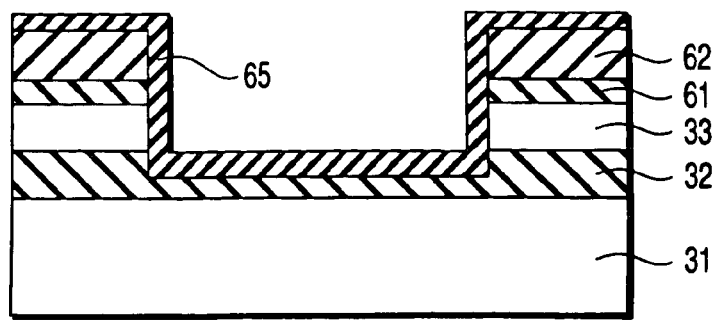

Then, as shown in FIG. 18D, a sidewall protection film 65 is formed. SiN is used to form the sidewall protection film 65.

Figure 18E:
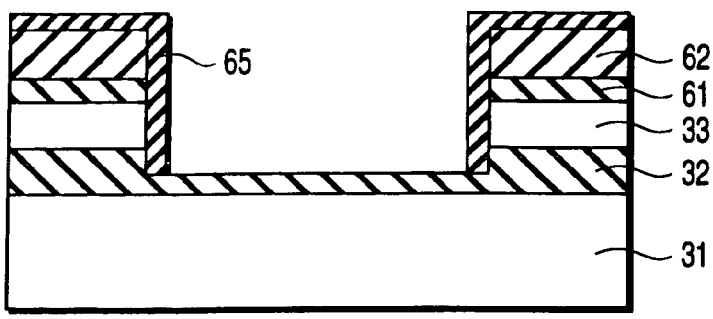

After this, as shown in FIG. 18E, part of the SiN film 65 except the sidewall thereof is removed. For removal of part of the SiN film 65 except the sidewall thereof, an etching method using plasma which is an anisotropic etching method is used.

Figure 18F:
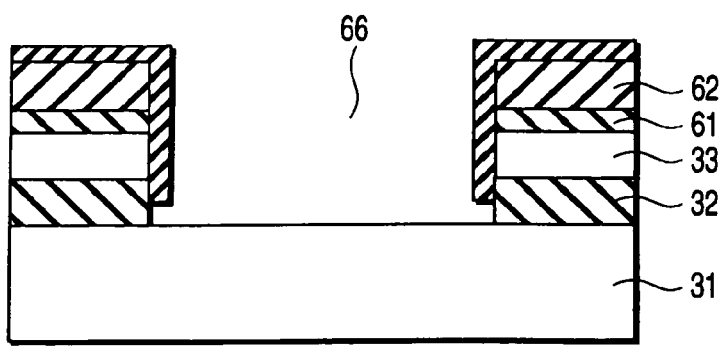

Next, as shown in FIG. 18F, the remaining part of the BOX layer 32 is removed and formation of an opening portion 66 is terminated. In this case, for removal of the BOX layer 32, a wet etching process which gives less damage is used.

Figure 18G:
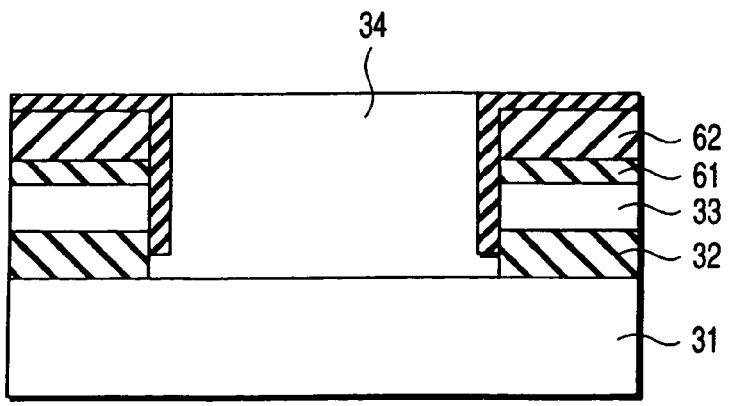

Then, as shown in FIG. 18G, a silicon layer 34 is formed so as to be buried or filled in the opening portion 66. For formation of the silicon layer 34, a method for selectively epitaxial-growing silicon is used. The film formation condition of the silicon layer is the same as that of each of the sixth and seventh embodiments.

Next, the protection oxide film 61 and SiN layer 62 on the SOI layer 33 are removed and formation of the partial SOI substrate is terminated.

After this, MOSFETs configuring a logic circuit are formed in the SOI layer 33 and trench type memory cells are formed in the silicon layer 34.

According to the above manufacturing method, semiconductor devices with the structures as shown in FIGS. 4 to 6 can be obtained according to the thickness of the epitaxial silicon layer 34. That is, the semiconductor device with the structure shown in FIG. 4 can be obtained by setting the upper surface of the epitaxial silicon layer 34 lower than the upper surface of the SOI layer 33 and higher than the upper surface of the buried oxide layer 32. Further, the semiconductor device with the structure shown in FIG. 5 can be obtained by setting the upper surface of the epitaxial silicon layer 34 higher than the upper surface of the SOI layer 33. In addition, the semiconductor device with the structure shown in FIG. 6 can be obtained by setting the upper surface of the epitaxial silicon layer 34 sufficiently higher than the upper surface of the SOI layer 33.

The electrical characteristic of the non-SOI region formed by the above method was evaluated in the same manner as that in the sixth and seventh embodiments. As a result, in the partial SOI substrate according to the eighth embodiment, the percentage of diodes in which leakage currents flowed was 2% or less and a partial SOI substrate of high quality could be obtained.

[Ninth Embodiment]

In the ninth embodiment, the exposed surface of a supporting substrate 31 is subjected to heat treatment (hydrogen annealing process) after the surface of the supporting substrate (silicon substrate) 31 is exposed and before an epitaxial silicon layer 34 is formed in the manufacturing method of the semiconductor device according to any one of the sixth to eighth embodiments. By performing the hydrogen annealing process, COP (Crystal Originated Particle) of the exposed portion of the silicon substrate 31 and BMD (Bulk Microdefect) of a portion near the exposed portion can be eliminated and a DZ (Denuded Zone) layer can be formed. Further, the concentration of oxygen in a portion of the silicon substrate 31 which lies near the interface between the silicon substrate 31 and the epitaxial silicon layer 34 is lower than the concentration of oxygen in a portion of the silicon substrate 31 which lies near and directly under the BOX layer 32.

By the above manufacturing method, the effect of suppression of an increase in the leakage current and retention thereof can be further improved.

As described above, according to one aspect of this invention, a semiconductor device using the partial SOI substrate and the manufacturing method thereof in which an increase in the leakage current and a degradation in the pause characteristic can be suppressed can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a supporting substrate including a first region and a second region, the second region having a top surface lower than a top surface of the first region;
a buried oxide layer formed on the first region of the supporting substrate;
a semiconductor layer formed on the buried oxide layer;
a first element formed in the semiconductor layer;
an epitaxial layer formed on the second region of the supporting substrate, an interface between the epitaxial layer and the supporting substrate being set in a portion which lies deeper than the buried oxide layer;
a second element formed in the epitaxial layer, the second element having an active region which lies shallower than the interface between the supporting substrate and the epitaxial layer; and
a first element isolation region interposed between the epitaxial layer and the semiconductor layer, the first element isolation region being formed from an upper surface of the semiconductor layer at least up to a portion where the buried oxide layer is formed, the first element isolation region and the buried oxide layer allowing the semiconductor layer to be electrically insulated from the epitaxial layer and the supporting substrate.

2. A semiconductor device according to claim 1, wherein the second element includes a trench type memory cell of a DRAM, and the trench type memory cell includes a cell transistor and a trench capacitor.

3. A semiconductor device according to claim 1, wherein the supporting substrate, the semiconductor layer and the epitaxial layer are formed of silicon, and the buried oxide layer is formed of silicon oxide.

4. A semiconductor device according to claim 2, further comprising:
a first well region formed in the epitaxial layer,
wherein a collar oxide layer of the trench capacitor is formed in the first well region.

5. A semiconductor device according to claim 4, wherein the trench capacitor is formed in the epitaxial layer between the first well region and the interface between the supporting substrate and the epitaxial layer.

6. A semiconductor device according to claim 4, further comprising:
a second well region formed in the first well region,
wherein a buried strap and a source region and a drain region of the cell transistor are formed in the second well region.

7. A semiconductor device according to claim 6, wherein the buried strap electrically connects the drain region of the cell transistor and the trench capacitor.

8. A semiconductor device according to claim 6, further comprising:
a source electrode buried and formed in the second well region and in contact with the source region; and
a second element isolation region formed on a drain region side in the second well region.

9. A semiconductor device according to claim 1, wherein the first element includes a MOSFET forming at least a part of a logic circuit.

* * * * *

UNITED STATES PATENT AND TRADEMARK OFFICE
CERTIFICATE OF CORRECTION

PATENT NO.       : 7,112,822 B2
APPLICATION NO.  : 11/013910
DATED            : September 26, 2006
INVENTOR(S)      : Nagano et al.

It is certified that error appears in the above-identified patent and that said Letters Patent is hereby corrected as shown below:

On the title page, the Terminal Disclaimer information has been omitted. Item (45) and the Notice information should read as follows:

--(45) **Date of Patent: *Sep. 26, 2006**

(*) Notice:  Subject to any disclaimer, the term of this patent is extended or adjusted under 35 U.S.C. 154(b) by 0 days.

This patent is subject to a terminal disclaimer.--

Signed and Sealed this

Eighteenth Day of September, 2007

JON W. DUDAS
*Director of the United States Patent and Trademark Office*